United States Patent
van Bentum et al.

(10) Patent No.: US 8,431,455 B2
(45) Date of Patent: Apr. 30, 2013

(54) METHOD OF IMPROVING MEMORY CELL DEVICE BY ION IMPLANTATION

(75) Inventors: Ralf van Bentum, Moritzburg (DE); Nihar-Ranjan Mohapatra, Leipzig (DE)

(73) Assignee: Globalfoundries Inc., Grand Cayman (KY)

(*) Notice: Subject to any disclaimer, the term of this patent is extended or adjusted under 35 U.S.C. 154(b) by 157 days.

(21) Appl. No.: 13/169,360

(22) Filed: Jun. 27, 2011

(65) Prior Publication Data

US 2012/0329220 A1   Dec. 27, 2012

(51) Int. Cl.
*H01L 21/8238* (2006.01)

(52) U.S. Cl.
USPC ........... 438/232; 438/275; 438/307; 438/529; 257/903

(58) Field of Classification Search ............... 438/232, 438/275, 306, 307, 527, 529; 257/903
See application file for complete search history.

(56) References Cited

U.S. PATENT DOCUMENTS

| 5,796,651 | A |  | 8/1998 | Horne et al. |
|---|---|---|---|---|
| 5,936,286 | A |  | 8/1999 | Sun |
| 6,008,080 | A | * | 12/1999 | Chuang et al. ............... 438/200 |
| 6,198,173 | B1 |  | 3/2001 | Huang |
| 7,691,700 | B2 | * | 4/2010 | Mehrotra et al. ............. 438/227 |
| RE42,145 | E |  | 2/2011 | Hobson |
| 2007/0181958 | A1 | * | 8/2007 | Jung ............................ 257/393 |
| 2009/0140341 | A1 | * | 6/2009 | Pillarisetty et al. ........... 438/275 |

* cited by examiner

*Primary Examiner* — Fernando L Toledo
*Assistant Examiner* — Bryan Junge
(74) *Attorney, Agent, or Firm* — Williams, Morgan & Amerson, P.C.

(57) ABSTRACT

Disclosed herein is a method of forming a memory device. In one example, the method includes performing a first ion implantation process with dopant atoms of a first type to partially form extension implant regions for a pull-down transistor and to fully form extension implant regions for a pass gate transistor of the memory device and, after performing the first ion implantation process, forming a first masking layer that masks the pass gate transistor and exposes the pull-down transistor to further processing. The method concludes with the step of performing a second ion implantation process with dopant atoms of the first type to introduce additional dopant atoms into the extension implant regions for the pull-down transistor that were formed during the first ion implantation process while masking the pass gate transistor from the second ion implantation process with the first masking layer.

18 Claims, 4 Drawing Sheets

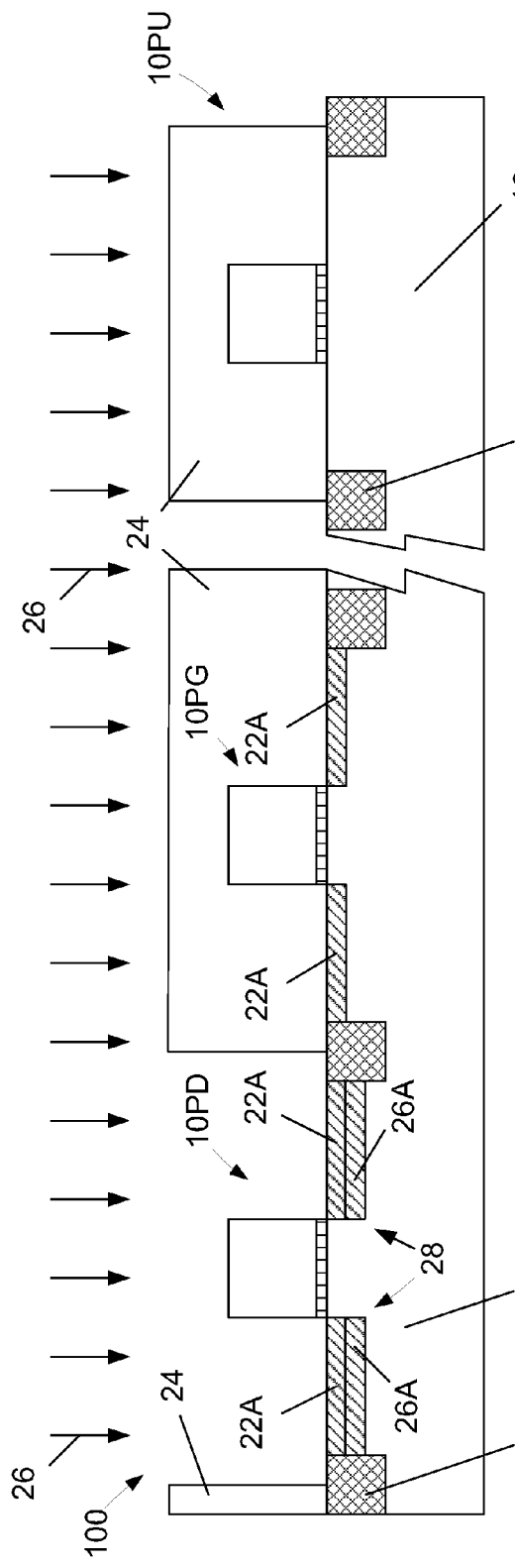
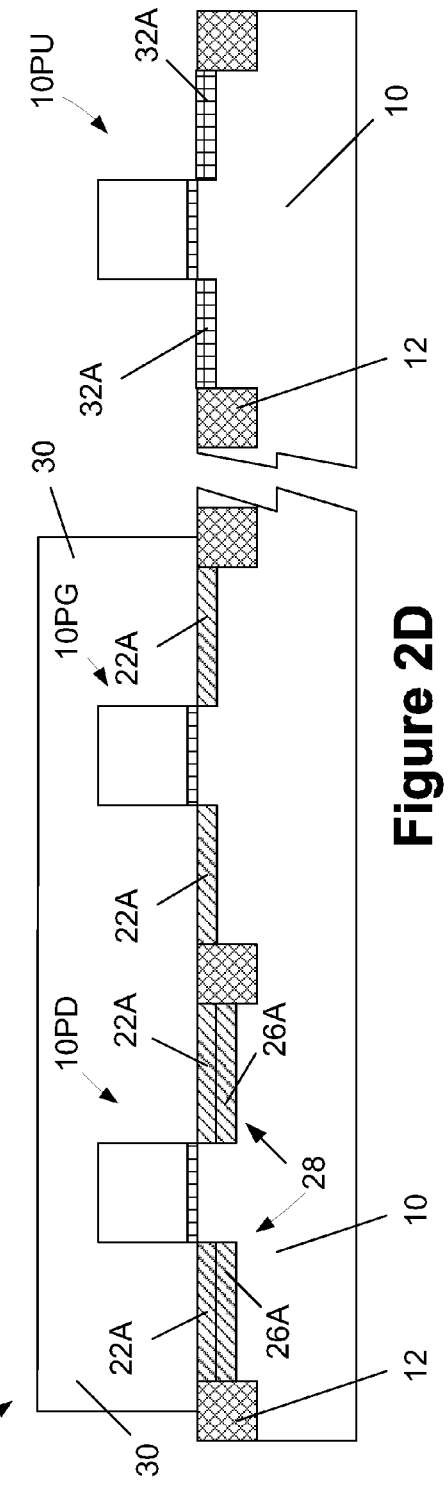

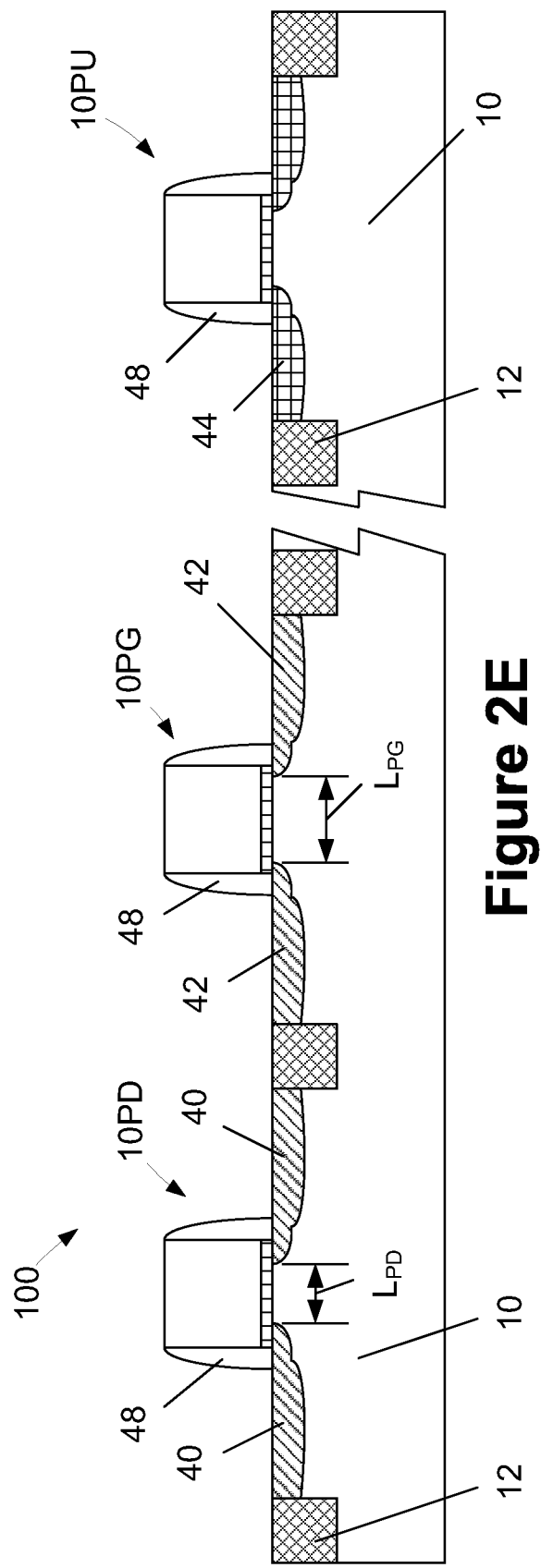

METHOD OF IMPROVING MEMORY CELL DEVICE BY ION IMPLANTATION

BACKGROUND OF THE INVENTION

1. Field of the Invention

The present disclosure generally relates to the manufacturing of sophisticated semiconductor devices, and, more specifically, to a method of increasing the performance of memory cell devices, such as SRAM memory devices, by performing a unique ion implantation scheme.

2. Description of the Related Art

Semiconductor memory devices are in widespread use in many modern integrated circuit devices and in many consumer products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Special read/write circuitry is used to access the memory device to store digital information on such a memory device and to determine whether or not a charge is presently stored in the memory device. These program/erase cycles ("P/E cycles") typically occur millions of times for a single memory device over its effective lifetime.

In general, efforts have been made to reduce the physical size of such memory devices, particularly reducing the physical size of components of the memory devices, such as transistors, to increase the density of memory devices, thereby increasing performance and decreasing the costs of the integrated circuits incorporating such memory devices. Increases in the density of the memory devices may be accomplished by forming smaller structures within the memory device and by reducing the separation between the memory devices and/or between the structures that make up the memory device. Often, these smaller design rules are accompanied by layout, design and architectural modifications which are either made possible by the reduced sizes of the memory device or its components, or such modifications are necessary to maintain performance when such smaller design rules are implemented. As an example, the reduced operating voltages used in many modern-day conventional integrated circuits are made possible by improvements in design, such as reduced gate insulation thicknesses in the component transistors and improved tolerance controls in lithographic processing. On the other hand, reduced design rules make reduced operating voltages essential to limit the effects of hot carriers generated in small size devices operating at higher, previously conventional operating voltages.

Making SRAMs in accordance with smaller design rules, as well as using reduced internal operating voltages, can reduce the stability of SRAM cells. Reduced operating voltages and other design changes can reduce the voltage margins which ensure that an SRAM cell remains in a stable data state during a data read operation, increasing the likelihood that the read operation could render indeterminate or lose entirely the data stored in the SRAM cell. As shown in FIG. 1, a typical 6T (six transistors) SRAM memory cell 200 includes two NMOS pass gate transistors 102A/B, two PMOS pull-up transistors 104A/B, and two NMOS pull-down transistors 106A/B. Each of the PMOS pull-up transistors 104A/B has its gate connected to the gate of a corresponding NMOS pull-down transistor 106A/B. The drains of the PMOS pull-up transistors 104A/B have their drains connected to the drains of corresponding NMOS pull-down transistors 106A/B to form inverters having the conventional configuration. The sources of the PMOS pull-up transistors 104A/B are connected to a high reference potential, typically $V_{CC}$, and the sources of the NMOS pull-down transistors 106A/B are connected to a lower reference potential, typically $V_{SS}$ or ground. The gates of the PMOS pull-up transistor 104A and the NMOS pull-down transistor 106A, which make up one inverter, are connected to the drains of the transistors 104B, 106B of the other inverter. Similarly, the gates of the PMOS pull-up transistor 104B and the NMOS pull-down transistor 106B, which make up the other inverter, are connected to the drains of the transistors 104A, 106A. Hence, the potential present on the drains of the transistors 104A, 106A (node N1) of the first inverter is applied to the gates of transistors 104B, 106B of the second inverter and the charge serves to keep the second inverter in an ON or OFF state. The logically opposite potential is present on the drains of the transistors 104B, 106B (node N2) of the second inverter and on the gates of the transistors 104A, 106A of the first inverter, keeping the first inverter in the complementary OFF or ON state relative to the second inverter. Thus, the latch of the illustrated SRAM cell 200 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of associated inverter, to unambiguously hold one of the inverters "ON" and unambiguously hold the other of the inverters "OFF", thereby preserving the memory state. The stability of an SRAM cell 200 can be quantified by the margin by which the potential on the charge storage nodes can vary from its nominal value while still keeping the SRAM 200 cell in its original state.

Data is read out of the conventional SRAM cell 200 in a non-destructive manner by selectively coupling each charge storage node (N1, N2) to a corresponding one of a pair of complementary bit lines (BL, $\overline{BL}$). The selective coupling is accomplished by the aforementioned of pass gate transistors 102A/B, where each pass gate transistor is connected between one of the charge storage nodes (N1, N2) and one of the complementary bit lines (BL, $\overline{BL}$). Word line signals are provided to the gates of the pass gate transistors 102A/B to switch the pass gate transistors ON during data read operations. Charge flows through the ON pass gate transistors to or from the charge storage nodes (N1, N2), discharging one of the bit lines and charging the other of the bit lines. The voltage changes on the bit lines are sensed by a differential amplifier (not shown).

Prior to a read out operation, the bit lines BL, $\overline{BL}$ are typically equalized at a voltage midway between the high and low reference voltages, typically ½ ($V_{CC}$-$V_{SS}$), and then a signal on the word line WL turns the pass gate transistors 102A/B ON. As an example, consider that N1 is charged to a predetermined potential of $V_{CC}$ and N2 is charged to a lower potential $V_{SS}$. When the pass gate transistors 102A/B turn ON, charge begins flowing from node N1 through pass gate transistor 102A to bit line BL. The charge on node N1 begins to drain off to the bit line BL and is replenished by charge flowing through pull-up transistor 104A to node N1. At the same time, charge flows from bit line BL through pass gate transistor 102B to node N2 and the charge flows from the node N2 through the pull-down transistor 106B. To the extent that more current flows through pass gate transistor 102A than flows through pull-up transistor 104A, charge begins to drain from the node N1, which, on diminishing to a certain level, can begin turning OFF pull-down transistor 106B. To the extent that more current flows through pass transistor 102B than flows through pull-down transistor 106B, charge begins to accumulate on charge storage node N2, which, on charging to a certain level, can begin turning OFF pull-up transistor 104A.

For the SRAM cell's latch to remain stable during such a data reading operation, at least one of the charge storage nodes (N1, N2) within the SRAM cell 200 must charge or discharge at a faster rate than charge flows from or to the corresponding bit line. In the past, one technique used to achieve this control is to configure the various transistors of the cell 200 such that the pass gate transistors 102A/B are strong enough to over-write the pull-up transistors 104A/B during a write operation, but weak enough so as to not over-write the pull-down transistors 106A/B during a read operation. One way this has been accomplished is to insure that the gate width of the pass transistors 102A/B is less than the gate width of the pull-down transistors 106A/B, but wider than the gate width of the pull-up transistors 104A/B. For very scaled memory cells, this difference in the gate widths of the various transistors may not provide enough confidence that the memory cell 200 will remain stable during operation. Another technique that has been employed, in addition to the difference in gate widths, is to provide an additional well implant (P-type dopant) for the pass gate transistors 102A/B in an attempt to further insure that the threshold voltage ($V_t$) of the pass gate transistors 102A/B is sufficiently high so as not to flip the bit cell during a read operation. This additional pass gate transistor well implant requires one additional masking operation and it tends to result in higher channel doping for the pass gate transistors 102A/B as compared to the pull-down transistors 106A/B, which has the desired effect of decreasing the performance of the pass gate transistors 102A/B as compared to the pull-down transistors 106A/B. However, this additional pass gate transistor well implant does have some adverse consequences as well, like higher gate induced leakage currents and greater variability due to more random dopant concentrations in the pass gate transistors 102A/B. Additionally, in highly scaled devices, due to manufacturing errors, e.g., undesirable dopant diffusion, misalignment of masking layers used during the implantation process, etc., the pull-down transistors 106A/B may also be affected by the additional pass gate transistor well implant process.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed towards the manufacturing of sophisticated semiconductor devices, and, more specifically, to various methods of increasing the performance and stability of memory cell devices, such as SRAM memory devices, by performing a unique ion implantation process, and the resulting devices. In one example, the method includes performing a first ion implantation process with dopant atoms of a first type to at least partially form extension implant regions for a pull-down transistor and for a pass gate transistor of the memory device and, after performing the first ion implantation process, forming a first masking layer that masks the pass gate transistor and exposes the pull-down transistor to further processing. The method concludes with the step of performing a second ion implantation process with dopant atoms of the first type to introduce additional dopant atoms into the extension implant regions for the pull-down transistor formed during the first ion implantation process while masking the pass gate transistor from the second ion implantation process with the first masking layer.

A further illustrative method includes forming a first masking layer that exposes a pass gate transistor and a pull-down transistor of a memory device to further processing, and performing a first ion implantation process with dopant atoms of a first type to partially form extension implant regions for the pull-down transistor and to fully form extension implant regions for the pass gate transistor, wherein the first ion implant process is performed at a dopant dose equal to a target final dopant dose for the extension implant regions for the pass gate transistor, the first ion implant process being performed with the first masking layer in place. The method further includes, after performing the first ion implantation process, forming a second masking layer that masks the pass gate transistor and exposes the pull-down transistor to further processing, and performing a second ion implantation process with dopant atoms of the first type to introduce additional dopant atoms into the extension implant regions for the pull-down transistor that were formed during the first ion implantation process, while masking the pass gate transistor from the second ion implantation process with the second masking layer during the second ion implant process. In one particularly illustrative example, the first ion implantation process is performed at a dopant dose that is approximately 50-80% of a target final dopant dose for the extension implant regions for the pull-down transistor.

BRIEF DESCRIPTION OF THE DRAWINGS

The disclosure may be understood by reference to the following description taken in conjunction with the accompanying drawings, in which like reference numerals identify like elements, and in which:

FIGS. 2A-2E depict one illustrative example of the novel process flow described herein and an illustrative resulting device.

Figure 1:
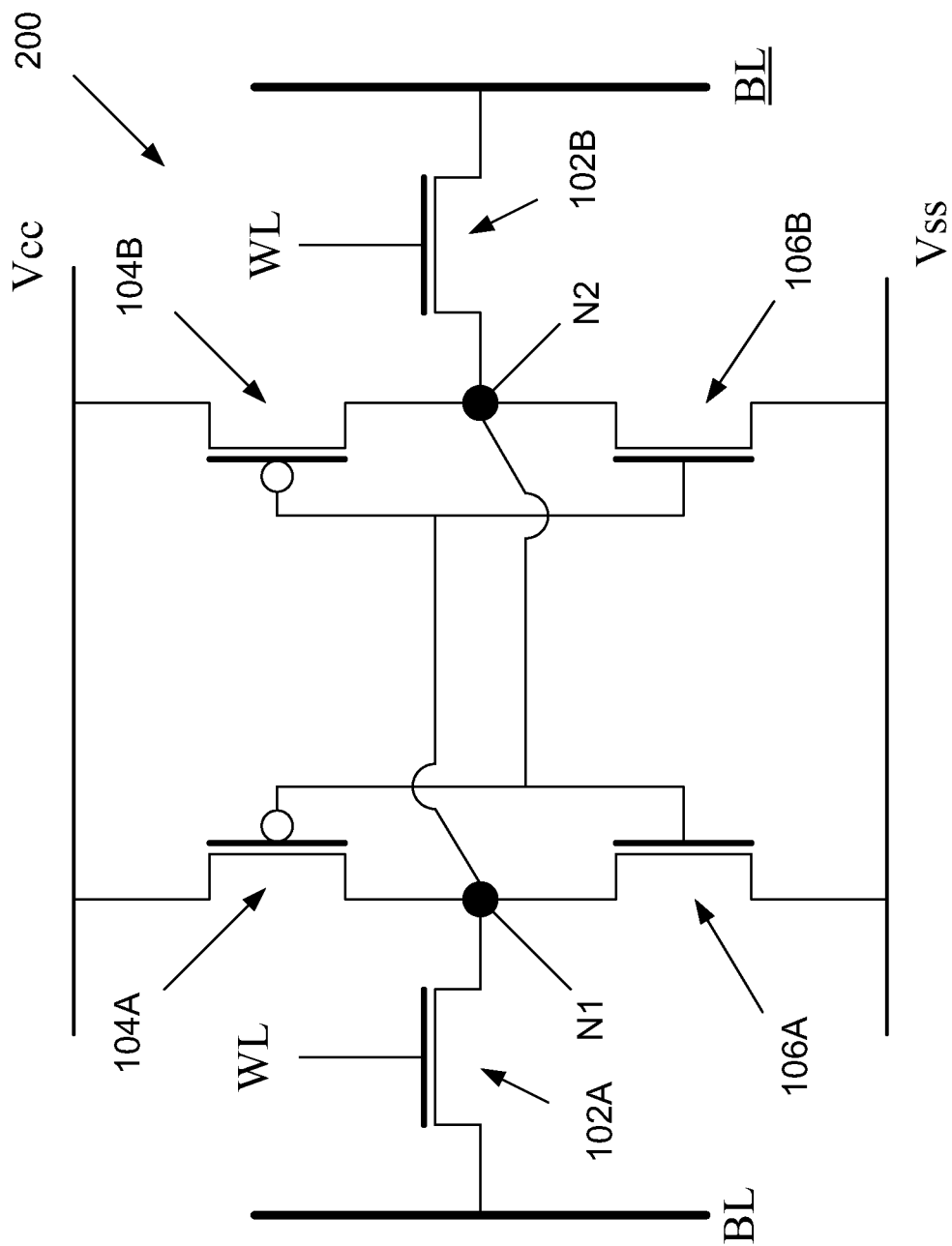
FIG. 1 schematically depicts an illustrative prior art SRAM memory device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to techniques that may be to various methods of increasing the performance and stability of memory cell devices, such as SRAM memory devices, by performing a unique ion implantation process, and the resulting devices. FIGS. 2A-2E depict one illustrative example of a novel process flow for producing an improved memory device, such as an illustrative SRAM device. However, after a complete reading of the present application, those skilled in the art will readily appreciate that the subject matter disclosed herein may also be applied to devices other than SRAM memory devices, such as, dual-port bit cells, etc. Thus, the fact that the present subject matter is disclosed in the context of the formation of an illustrative SRAM memory device should not be considered as a limitation of the inventions disclosed herein.

Figure 2A:
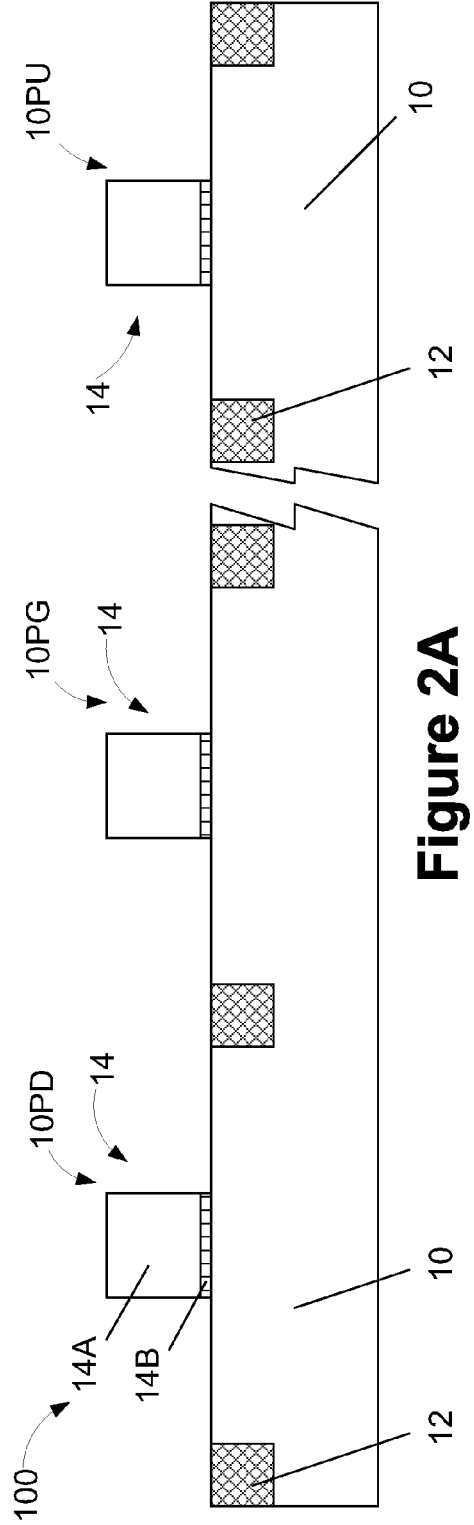

FIG. 2A depicts an illustrative SRAM device 100 that is generally comprised of an illustrative pull-down transistor 10PD, an illustrative pass gate transistor 10PG and an illustrative pull-up transistor 10PU. Typically, the pull-down transistor 10PD and the pass gate transistor 10PG are NMOS transistor devices while the pull-up transistor 10PU is a PMOS transistor device. The general functions performed by these various transistors in a typical SRAM memory device are well known to those skilled in the art. The pull-down transistor 10PD, the pass gate transistor 10PG and the pull-up transistor 10PU will be formed in and above a semiconducting substrate 10. The pull-down transistor 10PD, pass gate transistor 10PG and pull-up transistor 10PU are separated by illustrative isolation structures 12, e.g., a shallow trench isolation structure, formed in the substrate 10. In one illustrative embodiment, the semiconducting substrate 10 may be a silicon-on-insulator (SOI) substrate comprised of bulk silicon, a buried insulation layer (commonly referred to as a "BOX" layer) and an active layer (in and above which semiconductor devices are formed), which may also be a silicon material. Of course, the present invention may also be employed when the substrate 10 is made of semiconducting materials other than silicon and/or it may be in another form, such as a bulk silicon configuration. Thus, the terms substrate or semiconductor substrate should be understood to cover all forms of semiconductor structures.

At the stage of manufacture depicted in FIG. 2A, illustrative and schematically depicted generic gate electrode structures 14 are formed above the substrate 10 for each of the pull-down transistor 10PD, the pass gate transistor 10PG and the pull-up transistor 10PU. The illustrative gate electrode structures 14 include an illustrative gate electrode 14A and a gate insulation layer 14B. Of course, the materials of construction for the illustrative gate electrode structures 14 may, and likely will, vary depending upon whether the gate electrode structures 14 are for the pull-down transistor 10PD or pass gate transistor 10PG, or whether the gate electrode structure 14 is intended for the pull-up transistor 10PU. Thus, the presently disclosed inventions should not be considered as limited to any particular type of gate electrode structure 14, the composition and materials of construction for such gate electrode structures 14, or the manner in which such gate electrode structures 14 are made. For example, the gate electrode structures 14 may be made using techniques well known to those skilled in the art, such as gate-last or gate-first techniques, although the drawings depict an illustrative gate-first technique.

Additionally, prior to the formation of the illustrative gate electrode structures 14, deep n-wells will be formed in the substrate in the regions where pull-up transistors 10PU will be formed, and deep n-wells will be formed in the substrate 10 in the regions where the pull-down transistors 10PD and the pass gate transistors 10PG will be formed. For clarity purposes, these deep n-well and deep p-well regions are not depicted in the drawings. These deep n-well and deep p-well regions may be formed by performing known masking and ion implantation techniques.

Figure 2B:
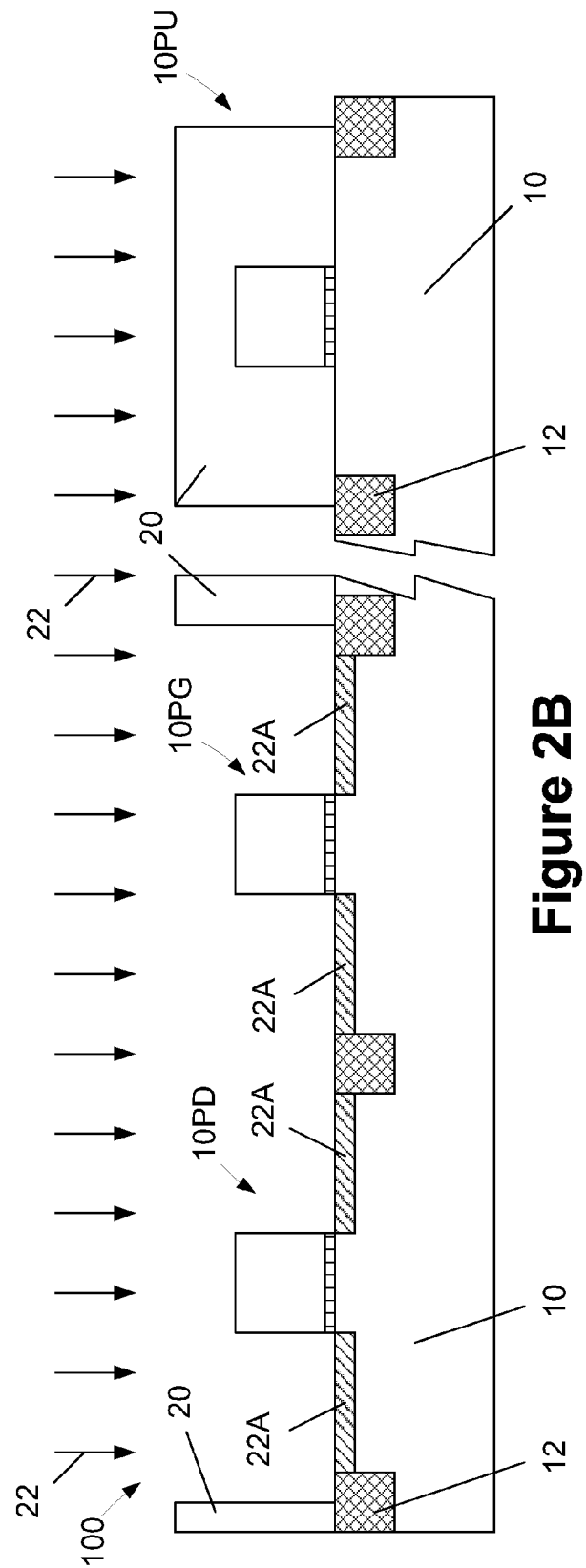

At the stage of manufacture depicted in FIG. 2B, a masking layer 20 is formed over the substrate 10. The masking layer 20 covers the pull-up transistor 10PU and exposes the pull-down transistor 10PD and the pass gate transistor 10PG to further processing. The masking layer 20 may be comprised of a variety of materials, e.g., photoresist. The masking layer 20 may be formed by a variety of techniques, e.g., spin-coating, etc. In one illustrative embodiment, the masking layer 20 is a layer of photoresist that is formed using traditional photolithography techniques, e.g., spin-on coating, soft-bake, exposure, hard bake and develop, etc.

Next, as shown in FIG. 2B, an extension ion implant process 22 is performed on the exposed pull-down transistor 10PD and pass gate transistor 10PG to define extension implant regions 22A in the substrate 10 for both of the transistors 10PD, 10PG. For purposes of clarity and explanation, physical size of the depicted extension regions 22A (and other implant regions in the drawings) may be exaggerated relative to other structures or regions. The ion implant process 22 is performed to implant N-type dopant materials, e.g., arsenic, phosphorus, etc., into the substrate 10. As will be clear to those skilled in the art after a complete reading of the present application, the implant process 22 will be the only ion implant process performed to form the extension regions for the pass gate transistor 10PG. Thus, the ion implant process 22 is performed with a dopant dose that is intended to be the target or final dopant dose for the extension regions from the pass gate transistor 10PG. In one illustrative example, the ion implant process 22 is performed using arsenic or phosphorous at a dopant dose of approximately 1-1.6 $E^{15}$ ions/cm² and at an energy level of approximately 2-3 keV. So-called HALO implants may be performed on the exposed pull-down transistor 10PD and pass gate transistor 10PG using a P-type dopant material before or after the implant process 22.

Next, as depicted in FIG. 2C, the masking layer 20 is removed and another masking layer 24 is formed over the substrate 10. The masking layer 24 covers the pull-up transistor 10PU and the pass gate transistor 10PG and exposes the pull-down transistor 10PD to further processing. Like the masking layer 20, the masking layer 24 may be comprised of a variety of materials, e.g., photoresist. It should be noted that, in the claims the various masking layers described herein may be referred to as "first," "second" or "third" masking layers for ease of reference. However, the use of such terminology in the claims should not be understood that the various masking layers are formed in a sequence that corresponds to the shorthand terminology employed in the claims. That is, for example, in the claims, a "second" masking layer may actually be formed prior to a so-called "first" masking layer, depending upon the language of the claims and the process flow employed to perform the inventive methods herein.

Then, as shown in FIG. 2C, an extension ion implant process 26 is performed on the exposed pull-down transistor 10PD to define implant regions 26A in the substrate 10. For purposes of clarity and explanation, the physical size of the depicted implant regions 26A (and other implant regions in the drawings) may be exaggerated relative to other structures or regions. The ion implant process 26 is performed to implant N-type dopant materials, e.g., arsenic, phosphorus, etc., into the substrate 10. The pull-down transistor 10PD also has a target or final desired dopant dose for the extension regions of the final pull-down transistor 10PD. As will be clear to those skilled in the art after a complete reading of the present application, the combination of the implant regions 22A and the implant regions 26A will constitute the final extension regions 28 for the pull-down transistor 10PD. Importantly, the dopant dose in the extension regions 22A for the pass-gate transistor 10PG were formed by performing an ion implant process with a dopant dose that is approximately 50-80% of the target or final dopant dose for the extension regions 28 of the pull-down transistor 10PD. As noted above, the final or target dose for the extension regions 28 for the pull-down transistor 10PD is the dosage of dopant atoms introduced during both of the implant processes 22, 26. In one illustrative example, the ion implant process 26 is performed using arsenic or phosphorous at a dopant dose of approximately 0.5-0.8 $E^{15}$ ions/cm² and at an energy level of approximately 2-3 keV.

Next, as depicted in FIG. 2D, the masking layer 24 is removed and another masking layer 30 is formed over the substrate 10. The masking layer 30 covers the pull-down transistor 10PD and the pass gate transistor 10PG and exposes the pull-up transistor 10PU to further processing. Like the masking layer 20, the masking layer 30 may be comprised of a variety of materials, e.g., photoresist.

Then, as shown in FIG. 2D an extension ion implant process 32 is performed on the exposed pull-up transistor 10PU to define extension regions 32A in the substrate 10. For purposes of clarity and explanation, the physical size of the depicted implant regions 32A (and other implant regions in the drawings) may be exaggerated relative to other structures or regions. The ion implant process 32 is performed to implant P-type dopant materials, e.g., boron, boron di-fluoride (BF₂), etc., into the substrate 10. In one illustrative example, the ion implant process 32 is performed using boron or boron di-fluoride (BF₂) at a dopant dose of approximately 1.5-2 $E^{15}$ ions/cm² and at an energy level of approximately 3 keV. So-called HALO implants may be performed on the exposed pull-up transistor 10PU using an N-type dopant material before or after the implant process 32. Of course, if desired, the implant process 32 could be performed prior to performing one or more of the implant processes 22, 26, depending upon the particular desired process flow. Such a change would be accompanied by associated changes in the masking sequence as well.

FIG. 2E depicts the device 100 at a later stage of manufacturer. More specifically, after the aforementioned extension implantation processes 22, 26 and 32 are performed, the device is subjected to additional processes, such as the formation of illustrative sidewall spacers; performing an additional source/drain implant, using an N-type dopant material, on the pull-down transistor 10PD and the pass gate transistor 10PG; performing an additional source/drain implant, using a P-type dopant material, on the pull-up transistor 10PU, etc. The aforementioned source/drain implants may be performed using know implantation and masking techniques. The dopant dose used in the source/drain implant process is typically of a larger concentration as compared to the dopant dose used in the extension implant processes described above. For purposes of clarity, the sequence of masking and ion implantation processes during the source/drain implant process are not depicted in the attached drawings.

FIG. 2E also depicts the device 100 after it has been subjected to one or more heating processes to activate the implanted dopant materials and to heal any damage to the lattice structure in the substrate 10. This results in the formation of final source/drain regions 40, 42 and 44 for the pull-down transistor 10PD, the pass gate transistor 10PG and pull-up transistor 10PU, respectively. Given the novel process flow described above, the extension regions 22A for the pass gate transistor 10PG have a lesser dopant concentration than the combined extension regions 28 for the pull-down transistor 10PD. As a result, the pass gate transistor 10PG will have an effective gate length $L_{PG}$ that is larger than the effective gate length $L_{PD}$ of the pull-down transistor 10PD (for purposes of clarity and explanation the effective lengths $L_{PG}$, $L_{PD}$ depicted in the drawings are exaggerated). In one illustrative example, the effective gate length $L_{PG}$ of the pass gate transistor 10PG is approximately 38-40 nm, whereas the effective gate length $L_{PD}$ of the pull-down transistor 10PD is approximately 32-34 nm. Expressed as a percentage, the effective gate length $L_{PG}$ of the pass gate transistor 10PG is approximately 110-125% of the effective gate length $L_{PD}$ of the pull-down transistor 10PD. As a result, the threshold voltage ($V_t$) of the pass gate transistor 10PG will be greater than the threshold voltage ($V_t$) of the pull-down transistor 10PD, which may help improve the performance of a memory cell incorporating such a structure, e.g., improved sigma rating ("Σ"), better short channel effects, less roll-off, reduced gate induced drain leakage, reduced sub-threshold slope, etc., as compared to prior art memory devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a memory device, comprising:
performing a first ion implantation process with dopant atoms of a first type to at least partially form extension implant regions for a pull-down transistor and for a pass gate transistor of said memory device;
after performing said first ion implantation process, forming a first masking layer that masks said pass gate transistor and exposes said pull-down transistor to further processing; and
performing a second ion implantation process with dopant atoms of said first type to introduce additional dopant atoms into said extension implant regions for said pull-down transistor that were formed during said first ion implantation process, while masking said pass gate transistor from said second ion implantation process with said first masking layer.

2. The method of claim 1, wherein said first ion implantation process is performed at a dopant dose that is approximately 50-80% of a final target dopant dose for final extension implant regions for said pull-down transistor.

3. The method of claim 1, wherein said first ion implantation process is performed using an N-type dopant material at a dopant dose of 1-1.6 $E^{15}$ ions/cm$^2$.

4. The method of claim 1, wherein said second ion implantation process is performed using an N-type dopant material at a dopant dose of 0.5-0.8 $E^{15}$ ions/cm$^2$.

5. The method of claim 1, further comprising, prior to performing said first ion implantation process, forming a second masking layer that exposes said pull-down transistor and said pass gate transistor and covers a pull-up transistor of said memory device and performing said first ion implantation process with said second masking layer in place.

6. The method of claim 5, further comprising:
after performing said second ion implantation process, forming a third masking layer that covers said pull-down transistor and said pass gate transistor and exposes said pull-up transistor to further processing; and
performing a third ion implantation process with dopant atoms of a second type that is opposite to said first type to form extension implant regions for said pull-up transistor while said third masking layer is in place.

7. The method of claim 1, further comprising performing a source/drain ion implantation process to form source/drain regions for said pull-down transistor and said pass gate transistor.

8. The method of claim 7, further comprising performing at least one heating process to form final source/drain regions for said pull-down transistor and said pass gate transistor, said pass gate transistor having an effective gate length that is greater than an effective gate length of said pull-down transistor.

9. The method of claim 1, wherein said memory device is an SRAM device, said pull-down transistor and said pass gate transistor are NMOS transistors, and said pull-up transistor is a PMOS transistor.

10. A method of forming a memory device comprising a pull-down transistor and a pass gate transistor, wherein said pull-down transistor will have extension implant regions and a target final dopant dose for said extension implant regions of said pull-down transistor, and wherein said pass gate transistor will have extension implant regions with a target final dopant dose for said extension implant regions of said pass gate transistor, the method comprising:
forming a first masking layer that exposes said pass gate transistor and said pull-down transistor to further processing;
performing a first ion implantation process with dopant atoms of a first type to partially form extension implant regions for said pull-down transistor and to fully form extension implant regions for said pass gate transistor, said first ion implantation process being performed at a dopant dose equal to said target final dopant dose for said extension implant regions for said pass gate transistor, said first ion implantation process being performed with said first masking layer in place;
after performing said first ion implantation process, forming a second masking layer that masks said pass gate transistor and exposes said pull-down transistor to further processing; and
performing a second ion implantation process with dopant atoms of said first type to introduce additional dopant atoms into said extension implant regions for said pull-down transistor that were formed during said first ion implantation process, while masking said pass gate transistor from said second ion implantation process with said second masking layer during said second ion implantation process.

11. The method of claim 10, wherein said first ion implantation process is performed at a dopant dose that is approximately 50-80% of said target final dopant dose for said extension implant regions for said pull-down transistor.

12. The method of claim 10, further comprising performing a source/drain ion implantation process to form source/drain regions for said pull-down transistor and said pass gate transistor.

13. The method of claim 12, further comprising performing at least one heating process to form final source/drain regions for said pull-down transistor and said pass gate transistor, said pass gate transistor having an effective gate length that is greater than an effective gate length of said pull-down transistor.

14. The method of claim 10, wherein said memory device further comprises a pull-up transistor, the method further comprising:
after performing said second ion implantation process, forming a third masking layer that covers said pull-down transistor and said pass gate transistor and exposes said pull-up transistor to further processing; and
performing a third ion implantation process with dopant atoms of a second type that is opposite to said first type to form extension implant regions for said pull-up transistor while said third masking layer is in place.

15. A method of forming a memory device comprising a pull-down transistor and a pass gate transistor, wherein said pull-down transistor will have extension implant regions and a target final dopant dose for said extension implant regions of said pull-down transistor, and wherein said pass gate transistor will have extension implant regions with a target final dopant dose for said extension implant regions of said pass gate transistor, the method comprising:
forming a first masking layer that exposes said pass gate transistor and said pull-down transistor to further processing;
performing a first ion implantation process with dopant atoms of a first type to partially form extension implant regions for said pull-down transistor and to fully form extension implant regions for said pass gate transistor, said first ion implantation process being performed at a dopant dose that is approximately 50-80% of said target final dopant dose for said extension implant regions for said pull-down transistor, said first ion implantation process being performed with said first masking layer in place;

after performing said first ion implantation process, forming a second masking layer that masks said pass gate transistor and exposes said pull-down transistor to further processing; and performing a second ion implantation process with dopant atoms of said first type to introduce additional dopant atoms into said extension implant regions for said pull-down transistor that were formed during said first ion implantation process, while masking said pass gate transistor from said second ion implantation process with said second masking layer during said second ion implantation process, said second ion implantation process being performed at a dopant dose that, when combined with the dopant dose used during said first ion implantation process, is approximately equal to said target final dopant dose for said extension implant regions for said pull-down transistor.

16. The method of claim 15, wherein said memory device further comprises a pull-up transistor, the method further comprising:

after performing said second ion implantation process, forming a third masking layer that covers said pull-down transistor and said pass gate transistor and exposes said pull-up transistor to further processing; and performing a third ion implantation process with dopant atoms of a second type that is opposite to said first type to form extension implant regions for said pull-up transistor while said third masking layer is in place.

17. The method of claim 16, further comprising performing a source/drain ion implantation process to form source/drain regions for said pull-down transistor and said pass gate transistor.

18. The method of claim 17, further comprising performing at least one heating process to form final source/drain regions for said pull-down transistor and said pass gate transistor, said pass gate transistor having an effective gate length that is greater than an effective gate length of said pull-down transistor.

* * * * *